United States Patent
Hassan et al.

(10) Patent No.: US 10,267,989 B2
(45) Date of Patent: Apr. 23, 2019

(54) PRESTRUCTURED SUBSTRATE FOR THE PRODUCTION OF PHOTONIC COMPONENTS, ASSOCIATED PHOTONIC CIRCUIT AND MANUFACTURING METHOD

(71) Applicant: Commissariat a l'energie atomique et aux energies alternatives, Paris (FR)

(72) Inventors: Karim Hassan, Grenoble (FR); Corrado Sciancalepore, Grenoble (FR); Helene Duprez, Seyssinet-Parizet (FR); Badhise Ben Bakir, Brezins (FR)

(73) Assignee: Commissariat à l'énergie atomique et aux énergies alternatives, paris (FR)

( * ) Notice: Subject to any disclaimer, the term of this patent is extended or adjusted under 35 U.S.C. 154(b) by 9 days.

(21) Appl. No.: 14/884,126

(22) Filed: Oct. 15, 2015

(65) Prior Publication Data
US 2016/0124145 A1 May 5, 2016

(30) Foreign Application Priority Data
Oct. 29, 2014 (FR) ...................................... 14 60386

(51) Int. Cl.
*G02B 6/12* (2006.01)
*G02B 6/122* (2006.01)
(Continued)

(52) U.S. Cl.
CPC ......... *G02B 6/122* (2013.01); *G02B 6/12004* (2013.01); *G02B 6/124* (2013.01);
(Continued)

(58) Field of Classification Search
CPC .... G02B 6/122; G02B 6/12004; G02B 6/124; G02B 6/30; H01S 5/026; H01S 5/3031
See application file for complete search history.

(56) References Cited

U.S. PATENT DOCUMENTS 4,756,976 A * 7/1988 Komeya ............... C04B 35/581
                                                  257/E23.113
5,288,769 A * 2/1994 Papageorge ............. C09J 9/02
                                                  252/510
(Continued)

FOREIGN PATENT DOCUMENTS

EP 1 282 834 B1 8/2005
EP 2 759 858 A2 7/2014
(Continued)

OTHER PUBLICATIONS

French Preliminary Search Report dated Jul. 28, 2015 in French Application 14 60386 filed on Oct. 29, 2014 (with English Translation of Categories of Cited Documents).

*Primary Examiner* — Peter Radkowski
(74) *Attorney, Agent, or Firm* — Oblon, McClelland, Maier & Neustadt, L.L.P.

(57) ABSTRACT

A substrate locally pre-structured for the production of photonic components including a solid part made of silicon; a first localised region of the substrate, including a heat dissipation layer, produced in a localised manner on the surface of the solid part and made of a material of which the refractive index is less than that of silicon; a wave guide on the heat dissipation layer; a second localised region of the substrate, including an oxide layer produced in a localised manner on the surface of the solid part, the oxide having a heat conductivity less than that of the material of the heat dissipation layer; a wave guide on the oxide layer.

10 Claims, 9 Drawing Sheets

(51) Int. Cl.
  *G02B 6/30* (2006.01)
  *H01S 5/30* (2006.01)
  *G02B 6/124* (2006.01)
  *H01S 5/026* (2006.01)

(52) U.S. Cl.
  CPC .............. *G02B 6/30* (2013.01); *H01S 5/026* (2013.01); *H01S 5/3031* (2013.01); *G02B 2006/12061* (2013.01); *G02B 2006/12104* (2013.01); *G02B 2006/12121* (2013.01); *G02B 2006/12135* (2013.01)

(56) References Cited

U.S. PATENT DOCUMENTS

| | | | | |
|---|---|---|---|---|
| 5,475,775 | A * | 12/1995 | Kragl | G02B 6/30 264/1.24 |
| 5,545,291 | A * | 8/1996 | Smith | G02F 1/1362 257/E21.505 |
| 5,574,806 | A * | 11/1996 | Kragl | G02B 6/30 385/131 |
| 5,783,856 | A * | 7/1998 | Smith | G02F 1/1362 257/618 |
| 5,883,996 | A * | 3/1999 | Knapp | G02B 6/423 385/88 |
| 6,315,465 | B1 * | 11/2001 | Mizue | G02B 6/4201 385/94 |
| 6,393,185 | B1 | 5/2002 | Deacon | |
| 6,437,441 | B1 * | 8/2002 | Yamamoto | H01L 21/76801 257/262 |
| 6,566,240 | B2 * | 5/2003 | Udrea | H01L 21/84 257/E21.703 |
| 6,690,694 | B2 * | 2/2004 | Deacon | H01S 5/02248 372/29.02 |
| 6,847,748 | B2 * | 1/2005 | Benzoni | G02B 6/12 385/129 |
| 6,925,098 | B2 * | 8/2005 | Deacon | H01S 5/02248 372/20 |
| 6,962,835 | B2 * | 11/2005 | Tong | B23K 20/02 257/E21.505 |
| 7,002,252 | B2 * | 2/2006 | Yamamoto | H01L 21/76801 257/259 |
| 7,223,635 | B1 * | 5/2007 | Brewer | B81C 3/002 257/E21.505 |
| 7,230,314 | B2 * | 6/2007 | Udrea | H01L 21/84 257/502 |
| 7,257,283 | B1 * | 8/2007 | Liu | G02B 6/12004 385/14 |
| 7,298,937 | B2 * | 11/2007 | Keh | H01S 5/02212 385/14 |
| 7,535,089 | B2 * | 5/2009 | Fitzgerald | H01L 21/76254 257/103 |
| 7,653,104 | B2 * | 1/2010 | Fujimoto | B82Y 20/00 372/45.011 |
| 7,703,991 | B2 * | 4/2010 | Lu | G02B 6/4232 385/88 |
| 7,732,237 | B2 * | 6/2010 | Xie | B82Y 10/00 257/E33.014 |
| 7,754,507 | B2 * | 7/2010 | Epler | H01L 33/0079 257/E21.511 |
| 7,851,780 | B2 * | 12/2010 | Hudait | H01L 21/02381 257/14 |
| 7,881,571 | B2 | 2/2011 | Ben Bakir et al. | |
| 8,071,187 | B2 * | 12/2011 | Yamamoto | H01L 23/10 257/676 |
| 8,110,823 | B2 * | 2/2012 | Bowers | H01L 31/1852 257/14 |
| 8,238,704 | B2 | 8/2012 | Ben Bakir et al. | |
| 8,257,990 | B2 * | 9/2012 | Koch | G02B 6/4204 257/E21.158 |
| 8,285,102 | B2 | 10/2012 | Ben Bakir et al. | |
| 8,559,478 | B2 * | 10/2013 | Sysak | B82Y 20/00 372/108 |
| 8,604,577 | B2 * | 12/2013 | Koch | G02B 6/4204 257/432 |
| 8,879,593 | B2 * | 11/2014 | Kim | H01S 5/0224 372/36 |
| 8,912,017 | B2 * | 12/2014 | El-Ghoroury | H01L 27/14618 257/E21.514 |
| 8,937,296 | B2 * | 1/2015 | Bowers | H01L 31/1852 257/14 |
| 9,097,848 | B2 * | 8/2015 | Bowers | H01L 31/1852 257/14 |
| 9,581,761 | B2 * | 2/2017 | Liang | G02B 6/122 |
| 2001/0041029 | A1 | 11/2001 | Steinberg | G02B 6/30 385/50 |
| 2002/0009612 | A1 * | 1/2002 | Ramesh | B32B 9/00 428/688 |
| 2002/0034843 | A1 * | 3/2002 | Udrea | H01L 21/84 438/149 |
| 2002/0072138 | A1 * | 6/2002 | Trezza | H01L 31/167 438/23 |
| 2002/0158339 | A1 * | 10/2002 | Yamamoto | H01L 21/76801 257/758 |
| 2003/0086448 | A1 * | 5/2003 | Deacon | H01S 5/02248 372/20 |
| 2003/0095757 | A1 * | 5/2003 | Burmeister | G02B 6/4212 385/88 |
| 2003/0174968 | A1 * | 9/2003 | Kang | G02B 6/4204 385/52 |
| 2003/0183923 | A1 * | 10/2003 | Udrea | H01L 21/84 257/712 |
| 2004/0066806 | A1 * | 4/2004 | Deacon | H01S 5/02248 372/20 |
| 2005/0105911 | A1 * | 5/2005 | Keh | H01S 5/02212 398/138 |
| 2005/0221611 | A1 * | 10/2005 | Yamamoto | H01L 21/76801 438/639 |
| 2006/0251360 | A1 * | 11/2006 | Lu | G02B 6/4232 385/88 |
| 2006/0281203 | A1 * | 12/2006 | Epler | H01L 33/0079 438/22 |
| 2009/0078943 | A1 * | 3/2009 | Ishida | H01L 21/84 257/77 |
| 2009/0180504 | A1 * | 7/2009 | Fujimoto | B82Y 20/00 372/36 |
| 2009/0218666 | A1 * | 9/2009 | Yang | H01L 21/56 257/677 |
| 2009/0245298 | A1 * | 10/2009 | Sysak | B82Y 20/00 372/22 |
| 2010/0054290 | A1 * | 3/2010 | Hatakeyama | H01S 5/1835 372/36 |
| 2010/0178461 | A1 * | 7/2010 | Yamamoto | H01L 23/10 428/141 |
| 2011/0158278 | A1 * | 6/2011 | Koch | G02B 6/4204 372/45.012 |
| 2012/0189317 | A1 * | 7/2012 | Heck | H01S 5/021 398/141 |
| 2012/0288995 | A1 * | 11/2012 | El-Ghoroury | H01L 27/14618 438/107 |
| 2013/0022072 | A1 * | 1/2013 | Bowers | H01L 31/1852 372/45.01 |
| 2013/0208752 | A1 * | 8/2013 | Koch | G02B 6/4204 372/45.012 |
| 2013/0243020 | A1 * | 9/2013 | Kim | H01S 5/0224 372/36 |
| 2014/0212104 | A1 | 7/2014 | Cho et al. | |
| 2014/0251658 | A1 * | 9/2014 | Lin | H05K 1/0271 174/252 |
| 2015/0277040 | A1 * | 10/2015 | Liang | G02B 6/122 385/14 |

FOREIGN PATENT DOCUMENTS

| | | | | |
|---|---|---|---|---|
| EP | 2759858 A2 * | 7/2014 | ............ | G02B 6/136 |
| JP | 02306653 A * | 12/1990 | | |
| JP | WO 2014087877 A1 * | 6/2014 | ............ | H01L 23/15 |
| WO | WO 2014042637 A1 * | 3/2014 | ............ | G02B 6/122 |

* cited by examiner

PRESTRUCTURED SUBSTRATE FOR THE PRODUCTION OF PHOTONIC COMPONENTS, ASSOCIATED PHOTONIC CIRCUIT AND MANUFACTURING METHOD

TECHNICAL FIELD

The field of the invention is that of photonics and opto-electronics on micro-nano-structured silicon. The invention more particularly relates to a locally pre-structured substrate for the production of photonic components intervening particularly in networks for transmitting data by optical fibre and/or in free space or instead in integrated photonic circuits (intra-chip/inter-chip).

STATE OF THE PRIOR ART

The different active and passive photonic components form a complete library of components which makes it possible to realise all of the functions necessary for the processing of information by light on chip, from emission to reception, while passing through low loss transmission, wavelength multiplexing, and the high frequency manipulation of signals. This library encompasses lasers, RF components (modulators, photodiodes), passive components (guides, (de)multiplexers, resonant filters, couplers), and (de)coupling networks. Each of these components requires specific preparations to attain their optimal performances.

FIG. 6 is a sectional view that represents active and passive photonic components Cp produced on a SOI (Silicon-On-Insulator) substrate comprising an oxide layer BOX inserted between a solid part made of silicon 1 and a superficial thin layer of silicon 2. Four types of photonic components C1-C4 are represented in FIG. 6, with from left to right a laser C1, a modulator C2, a passive transmission component C3 and an optical fibre coupler C4.

The laser C1 includes a III-V semi-conductor optical amplifier 3 lying on an oxide layer 4 which covers a ridge wave guide 5 formed from the thin layer 2 of the SOI substrate.

The modulator C2 includes a modulation section of pn or pin diode type 6 formed by structuring and doping the thin layer 2 of the SOI substrate and covered with the oxide layer 4.

The passive component C3 includes a ridge wave guide 7 formed from the thin layer 2 of the SOI substrate and covered with the oxide layer 4. A metal layer 8 may be integrated in the oxide layer 4 at the end of the manufacturing process BEOL (Back-End Of Line) in order to serve as heating element.

The optical fibre coupler C4 includes a coupling network 9 formed by structuring the thin layer 2 of the SOI substrate and covered with the oxide layer 4.

The advent of integrated photonic circuits raises problems of compatibilities between these different photonic components C1-C4, in particular between passive components and active components. In fact, certain intrinsic parameters stemming from the nature of the materials used and/or the very functionality of the components require particular attention during design.

Since the refractive index of silicon is naturally sensitive to variations in temperature, most passive components are also very temperature sensitive, whereas certain components of the same circuit benefit from this particularity to carry out spatial-frequential adjustments (sometimes indispensable for overcoming manufacturing uncertainties). Other active components such as hybrid laser sources also generate (and undergo) harmful heating, the optimisation of which is indispensable for questions of reliability and ageing.

The integration of different components on a same substrate thus causes problems of compatibility and efficiency. It would thus be necessary at one and the same time to be able to control in a localised manner the heat produced in an undesirable manner by certain optoelectronic components such as lasers, to increase the resistivity of the substrate for the performances of optical RF components such as modulators, to reduce/cancel out the heat sensitivity of optical components made of silicon, to recover the optical power lost in the direction of the substrate for fibre couplers, and finally to heat in a rapid and efficient manner certain optical components.

Current solutions only deal with these problems on a case by case basis and do not always make it possible to envisage a complete integration. A solution is thus sought which makes it possible to improve all of the performances of all or part of the photonic chain (emission, modulation, transmission, etc.) by taking the best of each type of photonic component jointly.

DESCRIPTION OF THE INVENTION

The invention aims to provide a solution in this sense and to do this proposes a substrate locally pre-structured for the production of photonic components, comprising:
  a solid part made of silicon;
  a first localised region of the substrate, comprising:
    a layer, called heat dissipation layer, produced in a localised manner on the surface of the solid part and made of a material of which the refractive index is less than that of silicon;
    a wave guide on the heat dissipation layer;
  a second localised region of the substrate, separate from the first region, comprising:
    an oxide layer produced in a localised manner on the surface of the solid part, the oxide having a heat conductivity less than that of the material of the heat dissipation layer;
    a wave guide on the oxide layer.

The invention also relates to a photonic circuit comprising a semi-conductor optical amplifier lying on a localised region of a substrate comprising a solid part made of silicon, said region comprising:
  a layer, called heat dissipation layer, produced in a localised manner on the surface of the solid part made of a material of which the refractive index is less than that of silicon;
  a wave guide on the heat dissipation layer;
  a layer covering the wave guide made of an oxide of which the heat conductivity is less than that of the heat dissipation layer.

The invention also extends to the method of manufacturing the pre-structured substrate according to the invention, and particularly to a method comprising the steps of:
  formation, on a first area of a solid part made of silicon, of a layer, called heat dissipation layer, made of a material of which the refractive index is less than that of silicon;
  formation, on a second area of the solid part made of silicon, of a layer made of an oxide of which the heat conductivity is less than that of the material of the heat dissipation layer;
  transfer from a donor substrate of the material constituting the wave guide of the first region and the wave guide of the second region onto respectively the heat dissipation layer and the oxide layer of the second region.

BRIEF DESCRIPTION OF THE DRAWINGS

Other aspects, aims, advantages and characteristics of the invention will become clearer on reading the following detailed description of preferred embodiments thereof, given by way of non-limiting example, and made with reference to the appended drawings in which.

DETAILED DESCRIPTION OF PARTICULAR EMBODIMENTS

The invention relates to a substrate locally pre-structured for the production of photonic components. It also extends to a photonic component produced from such a substrate, as well as to a method of manufacturing such a substrate.

The invention makes it possible to anticipate the specific requirements of each type of photonic component by locally structuring in advance the substrate in a suitable manner to guarantee the optimal performances of each type of component. The problems of compatibility, efficiency, thermal and optical management are integrated in a same physical support, thereby minimising post-manufacturing steps, while guaranteeing good performances for all of the photonic circuitry.

Figure 1:
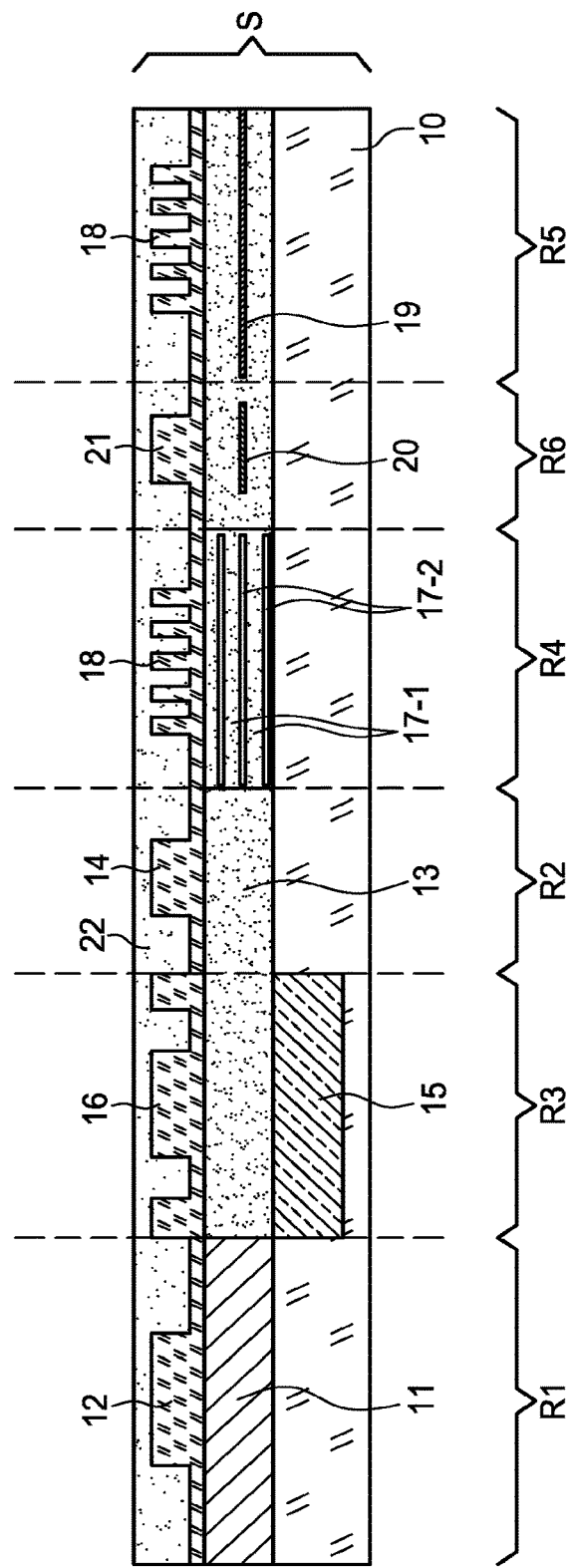
FIG. 1 is a sectional view of a substrate according to a possible embodiment of the invention.

FIG. 1 is a schematic sectional view of such a pre-structured substrate in an example embodiment of the invention illustrating all of the photonic components/functions which can be produced.

Figure 6:
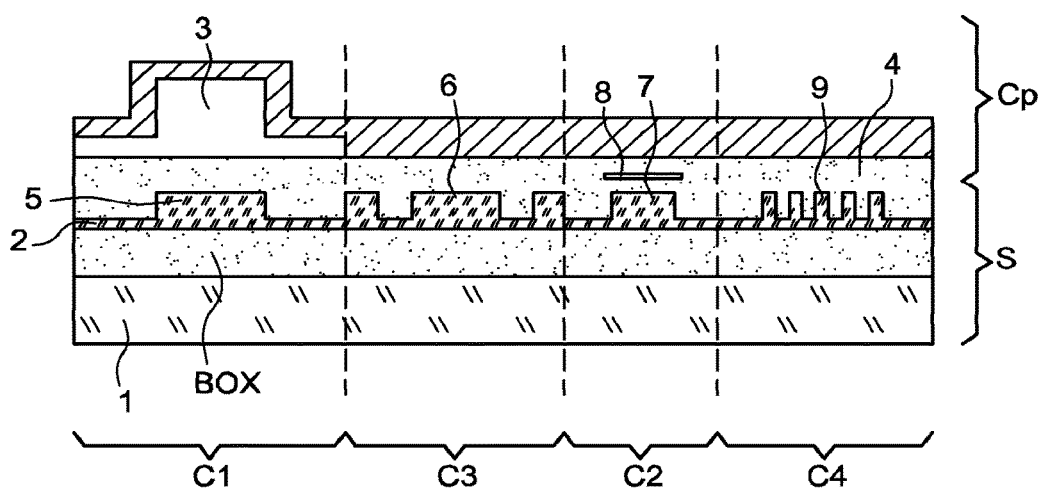
FIG. 6, already discussed previously, is a sectional view of a photonic circuit of the prior art elaborated on a SOI substrate.

It will in particular be noted, by comparison with FIG. 6, that the silica layer of a SOI substrate is substituted locally within the scope of the invention, by layers/structures of interest for the active and passive photonic components/functions situated above. All of these components/functions may be implemented as desired as a function of the type of photonic circuit to be produced, so as to minimise the post-manufacturing steps of the substrate.

With reference to FIG. 1, the substrate S according to the invention comprises a solid part made of silicon 10, and a first localised region R1 of the substrate which includes a layer 11, called heat dissipation layer, produced in a localised manner on the surface of the solid part 10 and made of a material of which the refractive index is less than that of silicon, and a wave guide 12 on the heat dissipation layer 11.

The substrate S furthermore comprises a second localised region R2 of the substrate which includes an oxide layer 13 produced in a localised manner on the surface of the solid part 10, the oxide having a heat conductivity less than that of the material of the heat dissipation layer 11. The second region further includes a wave guide 14 on the oxide layer 13.

The wave guides 12, 14 may be ridge wave guides as represented. They are covered with an oxide layer 22, typically a layer of $SiO_2$.

The wave guides 12, 14 are preferably made of monocrystalline silicon. In particular, as will be detailed hereafter, the material constituting the wave guides 12, 14 may have been transferred from a same donor substrate onto, respectively, the heat dissipation layer 11 of the first region R1 and the oxide layer 13 of the second region R2.

The heat dissipation layer 11 is for example made of AlN, $Al_2O_3$, ZnS, CaP, SiN. It forms a confined area of the substrate which forms a directional channel for transporting heat, which may be surrounded by oxide 13 so as to be thermally insulated.

Figure 2:
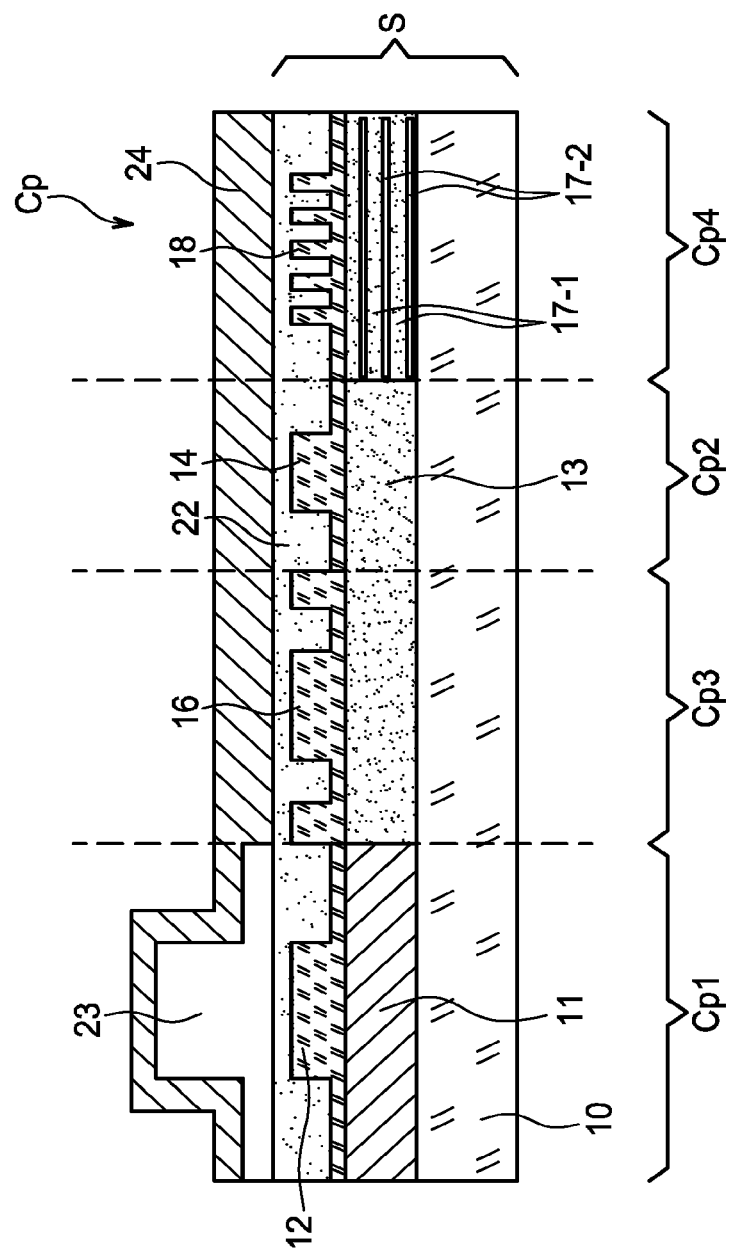
FIG. 2 is a sectional view of a photonic circuit elaborated on a substrate according to the invention.

As represented in FIG. 2 which represents a photonic circuit Cp being able to be produced within the scope of the invention, the first region R1 of the pre-structured substrate may be used for the constitution of a first photonic component Cp1 of laser type. The photonic circuit Cp then includes a semi-conductor optical amplifier 23, particularly a III-V material amplifier, lying on the first region R1 of the substrate S made of the heat dissipation layer 11, the wave guide 12 and the oxide layer 22 covering the wave guide 12.

The heat dissipation layer 11 makes it possible to dissipate better the heating of the laser than an oxide layer, such as a silica layer of a SOI substrate. Taking the example of a heat dissipation layer 11 constituted of alumina AlN, this makes it possible to reduce by 40% the maximum temperature within the laser compared to that which the laser would reach if the heat dissipation layer 11 was replaced by a silicon oxide layer, while dissipating efficiently the heat in the direction of the solid part 10 of the substrate. Such a layer is furthermore without impact on the optical properties of the laser given the small difference in the effective index of the guided optical mode in comparison with silica ($<10^{-4}$).

As represented in FIG. 2, the second region R2 of the pre-structured substrate may be used for the constitution of a second photonic component Cp2 of passive guiding component type.

The oxide layer 13 of the second region R2 (FIG. 1) may be a layer of $SiO_2$, the second photonic component Cp2 then forming a standard passive guiding component, or a layer of $TiO_2$, the second photonic component Cp2 then forming a passive guiding component with low sensitivity to changes of temperature.

Silicon has an intrinsic sensitivity to changes in temperature which modifies its refractive index and thus the properties of propagation of electromagnetic waves which are confined therein. This recurrent problem of photonics on silicon is normally dealt with by a local or overall control of the temperature, which drastically increases the total energy consumption of a photonic circuit. It is possible to reduce this thermo-optical sensitivity, and potentially to attain athermal operating conditions, thanks to certain materials the thermal properties of which are opposed to those of silicon in a complementary manner and compatible with the optical guiding functions. In particular, titanium dioxide satisfies both the sought after thermo-optical properties and the constraints of industrial manufacture within the scope of a CMOS compatible integration. It may thus be profitably used as material constituting the oxide layer 13 of the second region R2.

Returning to FIG. 1, the pre-structured substrate may comprise a third localised region R3 of the substrate and formed on a superficial localised portion 15 of the solid part 10 in which ions are implanted. The third region R3 includes an oxide layer 13 on said superficial portion 15 and a modulation section of pn or pin diode type 16.

The oxide layer of the third region is for example a silica layer. The modulation section 16 is made of monocrystalline silicon suitably structured and doped to form a pn or pin diode.

The use of silicon substrates for the high frequency electrical interconnections requires an adaptation of the impedance of the substrate in order to reduce problems of parasitic capacitances and harmful losses for the radiofrequency (RF) components (generation of noise which propagates in the substrate and impacts the neighbouring RF circuitry). This problem of diaphony between RF components on silicon may be dealt with by increasing the resistance of a solid silicon substrate in order to prevent the propagation of signals between RF components. The invention thus proposes including in the pre-structured substrate a localised region where the solid part made of silicon is rendered highly resistive by an implantation of ions (for example H+, or As+), namely said superficial portion 15.

In an embodiment variant, the third region R3 further includes a passivation layer (not represented) inserted between said superficial portion 15 and the oxide layer 13, for example a passivation layer made of poly-silicon, also designated poly-crystalline silicon. This passivation layer aims to passivate the interface between the oxide layer and the high resistivity silicon where a strong parasitic surface conduction could be created.

It will be noted that the superficial portion 15 of high resistivity silicon is obtained by doping or ion implantation and that it is consequently sensitive to the heat treatments undergone during the various manufacturing steps. A manufacturing method safeguarding against too important heat treatments will be described hereafter which makes it possible to conserve the high resistivity.

As represented in FIG. 2, the third region R3 of the pre-structured substrate may be used for the constitution of a third photonic component Cp3 of modulator type. Nevertheless the high resistivity pre-structuring may also benefit from other RF components (electrical connections in the same plane for example), thereby making the substrate according to the invention even more versatile (for example further enabling the integration of control circuits).

Returning to FIG. 1, the pre-structured substrate may comprise a fourth localised region R4 of the substrate which includes a multilayer mirror produced in a localised manner on the solid part 10 and an optical fibre coupling section 18 on the multilayer mirror. The multilayer mirror is made of an alternation of layers of oxide 17-1, typically layers of $SiO_2$, and silicon layers 17-2. It makes it possible to optimise the coupling of the photonic circuit to an optical fibre while recovering the intensity lost in the direction of the substrate.

For medium and long distance applications (i.e. from several meters to several kilometers), the favoured means of transport is the optical fibre. It is thus necessary to transfer light from the photonic circuit to the existing fibre network by an optical coupler. This may be a reverse taper or a coupling network which transfers the laser beam of sub-micronic size to a single-mode or multi-mode fibre which supports a mode of which the diameter is greater than 10 µm. These optical couplers assure an efficient transfer (few losses). This type of coupling is improved within the scope of the invention by the addition of a reflector (the multilayer mirror) under the (de)coupling network in order to recover efficiently the part of the optical signal lost in the direction of the substrate. As an example, a (de)coupling network on a mirror composed of two periods of silica/silicon makes it possible to reflect 84% of the incident signal in the direction of the fibre whereas the same network formed on a SOI substrate only reflects 65% of the incident signal.

As represented in FIG. 2, the fourth region R4 of the pre-structured substrate may be used for the constitution of a fourth photonic component Cp4 of optical fibre coupler type.

Still with reference to FIG. 1, the pre-structured substrate may comprise a fifth localised region R5 of the substrate which includes an oxide layer 13 on the solid part 1, said oxide layer incorporating a metal layer 19, and an optical fibre coupling section 18 on the oxide layer 13. The metal layer 19 here plays the role of mirror to assure the same function of reflection of the part of the optical signal lost in the direction of the substrate.

The pre-structured substrate may further comprise a sixth localised region R6 of the substrate which includes a layer 13 on the solid part 10, said layer incorporating a metal layer 20, and a wave guide 21 on said layer 13. The metal layer 20 makes it possible to heat optical components efficiently and very rapidly. It may be integrated in an oxide layer, such as a silica layer, or in a layer made of a material of which the heat conductivity is greater than that of the oxide and of which the refractive index is less than that of silicon, for example a layer made of AlN, $Al_2O_3$, ZnS, CaP, or SiN.

The addition of metal levels for the photonics generally takes place uniquely during steps of BEOL, thus after the formation of the optoelectronic components. Depositing a metal layer during prior manufacturing steps is a priori impossible with the current state of industrial manufacturing tools (due to problems of contamination of equipment in particular). By structuring and encapsulating in advance a metal level in a substrate dedicated for photonics, the invention brings multiple advantages.

Firstly, the multilayer structuring proposed previously as light reflector integrated under the coupling sections may be envisaged with a single level of metal encapsulated between two levels of oxide.

Then, arranging metal below certain components makes it possible to pre-arrange in situ heating elements such as those at present added during the steps of BEOL, necessary for good spatial-frequential adjustments. This type of functionalisation of the substrate also makes it possible to integrate a metal level inside a multilayer system with high heat conductivity (which is not the case in BEOL where the metal levels are encapsulated in silica, BCB, or SiN sometimes). Thus the material, for example AlN, proposed as heat dissipator for lasers may be advantageously used as heat conducting material for spatial-frequential adjustments of optical components, without degradation of the (electro-) optical performances. An improvement of the heating/cooling dynamic (response time) is also obtained with such a configuration.

The electrical connection of such a metal level as heating element may be achieved by means of standard vias, i.e. hollowed out above the structure (BEOL type), or instead by means of vias on the rear face called TSV (Through Silicon Vias).

Although the different localised regions of the pre-structured substrate bear the name of first region, second region, . . . , sixth region, this organisation must not be understood as signifying that a region of higher order may only be present if all of the regions of lower order are also present.

Quite the contrary, the substrate may comprise, as desired, one and/or the other of these regions R1-R6 taken alone or according to any combination.

Figure 5:
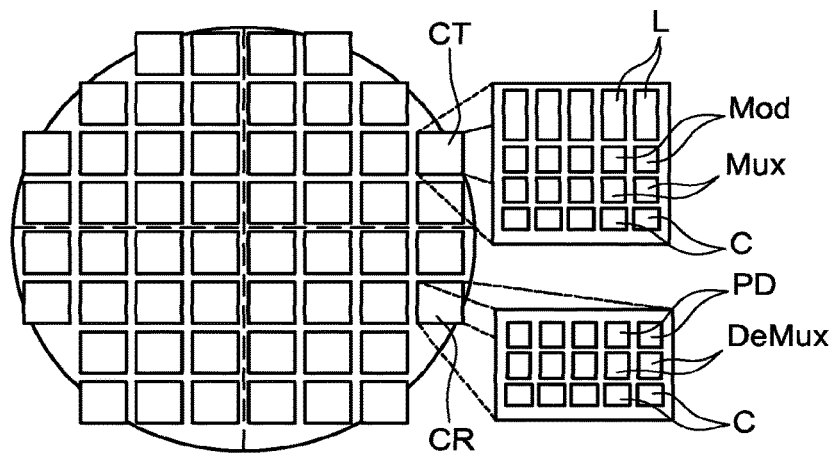
FIG. 5 is a top view of a substrate according to the invention comprising a set of elementary photonic cells in which is again shown a pre-structuring for a set of photonic components.

A standard set-up combining all of the functionalities described previously is nevertheless envisaged according to which a complete substrate is divided into elementary photonic cells, where each elementary cell groups together areas dedicated for each functionality. The average size of each family of component is known and the connections are assured within a cell by silicon guides with low propagation losses. This standard set-up is illustrated by FIG. 5, which again shows two types of elementary photonic cell. A first type of CT cell concerns transmitters: this encompasses lasers L, modulators Mod, multiplexers Mux, couplers C. The second type of CR cell concerns receivers: this encompasses couplers C, demultiplexers DeMux, photodiodes PD.

The invention is not limited to the pre-structured substrate as described previously, but extends to a photonic circuit produced from such a substrate as represented in FIG. 2, and in particular a photonic circuit Cp1 comprising a semiconductor optical amplifier 22 lying on a localised region R1 of a substrate comprising a solid part made of silicon 10, said region R1 comprising:

a layer 11, called heat dissipation layer, produced in a localised manner on the surface of the solid part 10 and made of a material of which the refractive index is less than that of silicon;

a wave guide 12 on the heat dissipation layer 11;

a layer 22 covering the wave guide 12 made of an oxide of which the heat conductivity is less than that of the heat dissipation layer 11.

An encapsulation layer 24, for example made of SiN, $TiO_2$, AlN or BCB, covers the photonic circuit Cp.

A method of manufacturing the pre-structured substrate according to the invention is described hereafter. This description is made with reference to FIGS. 3a-3g and 4a-4k which illustrate two possible embodiment variants of this method.

Figure 3A:
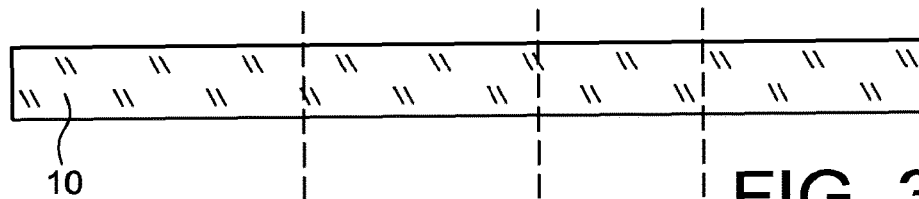
FIGS. 3a-3g represent a first variant of a method of manufacturing a substrate according to the invention.
Figure 4A:
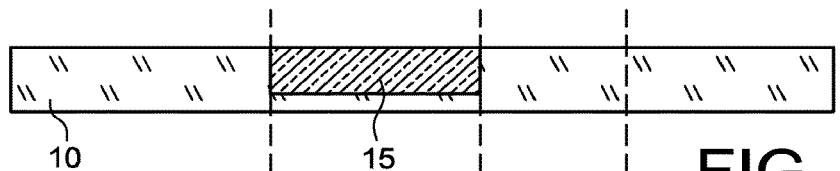
FIGS. 4a-4k represent a second variant of a method of manufacturing a substrate according to the invention.

As illustrated in FIGS. 3a and 4a, the manufacture of the pre-structured substrate according to the invention uses as starting base a monocrystalline silicon substrate 10, called solid silicon part in this document.

As illustrated in FIGS. 3c-3d and 4c-4d, the manufacture of the pre-structured substrate then includes a step of formation, on a first zone of the solid part made of silicon 10, of a layer 11, called heat dissipation layer, made of a material of which the refractive index is less than that of silicon, and a step of formation, on a second zone of the solid part made of silicon 10, of a layer 13 made of an oxide of which the heat conductivity is less than that of the material of the heat dissipation layer 11.

Then as illustrated in FIGS. 3e-3g and 4j-4k, the method includes the transfer from a donor substrate 30, 40 of the material constituting the wave guide of the first region and the wave guide of the second region onto respectively the heat dissipation layer 11 and the oxide layer 13 of the second region.

Within the scope of the variant illustrated by FIGS. 3a-3g, called "single transfer" variant, this step of transfer consists in transferring a monocrystalline silicon layer which will then be locally structured, and potentially locally doped, to form, according to the different pre-structured regions desired, the corresponding optoelectronic structures made of monocrystalline silicon (wave guides, modulation sections and coupling sections in particular). Within the scope of the variant illustrated by FIGS. 4a-4k, called "double transfer" variant, this transfer step consists in transferring the desired optoelectronic structures made of monocrystalline silicon.

Figure 3B:
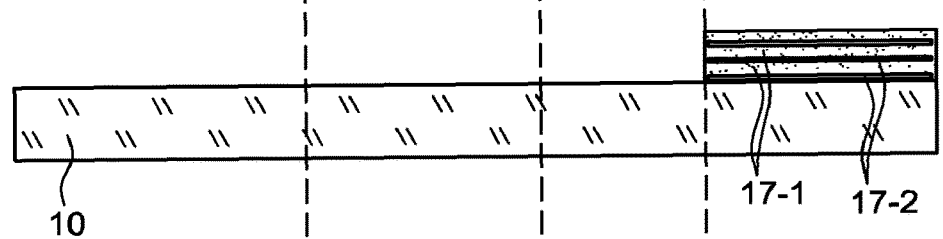
Figure 3C:
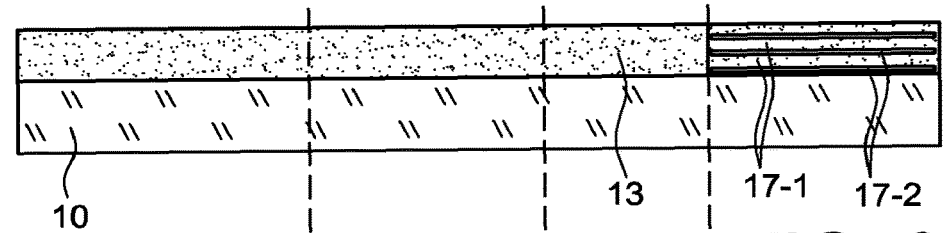

The "single transfer" variant is the following. Starting from a solid part made of silicon 10 (FIG. 3a), and when a fourth optical fibre coupling region R4 is desired, the formation of the multilayer mirror is carried out on an area of the solid part by alternating the deposition of silica layers 17-1 and silicon layers 17-2 (FIG. 3b). The deposition is then carried out (FIG. 3c) of a silica layer 13 on the solid part made of silicon 10. A layer of $TiO_2$ can also be locally deposited when it is wished to form a pre-structured region for athermal component. A heat dissipation layer may also be locally deposited. And one or more metal layers may be locally integrated within the silica layer 13 or the heat dissipation layer to serve as heater or mirror.

Figure 3D:
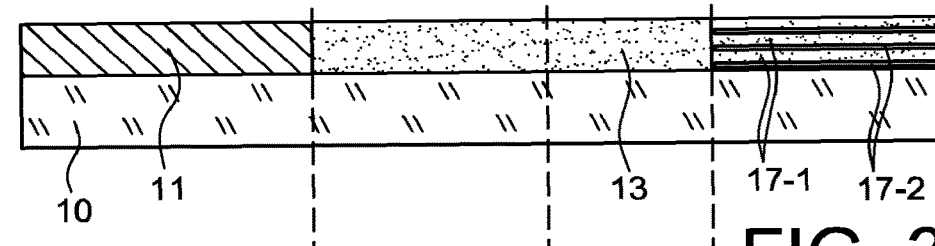

A localised etching of the silica layer 13 is then carried out, followed by the local deposition of the heat dissipation layer 11 of the first region R1, for example made of AlN (FIG. 3d).

Figure 3E:
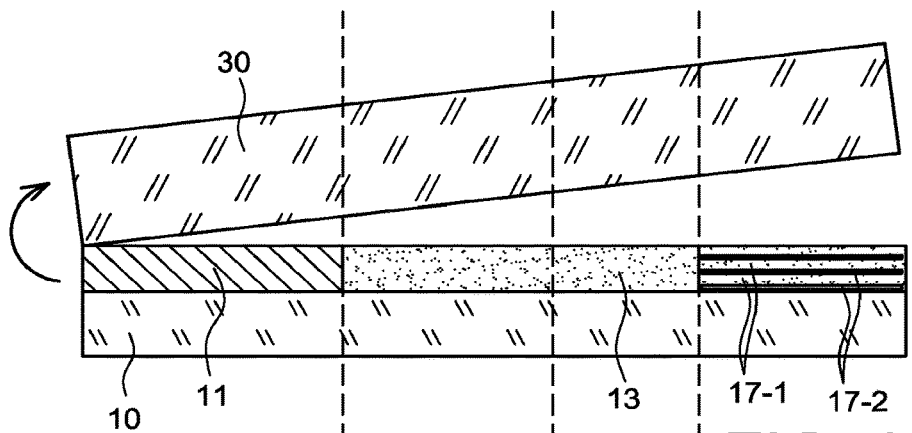
Figure 3F:
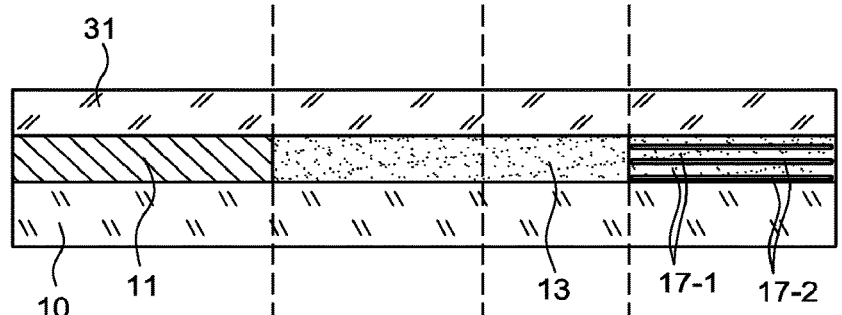

Then, as represented in FIGS. 3e-3f, the transfer is then carried out from a donor substrate 30 of a monocrystalline silicon layer 31 which will serve as material constituting optoelectronic structures intended to equip the different regions desired, in particular the wave guide 12 of the first region and the wave guide 14 of the second region for which said constitutive material is transferred onto respectively the heat dissipation layer 11 and the oxide layer 13 of the second region.

The donor substrate 30 may be a monocrystalline silicon substrate or a SOI substrate. The transfer may be carried out according to the Smart Cut™ method, the donor substrate 30 having been subjected beforehand to an ion implantation to form thereon a fragilised area at the level of which the donor substrate could be separated into two parts, one of which corresponds to the layer 31.

Figure 3G:
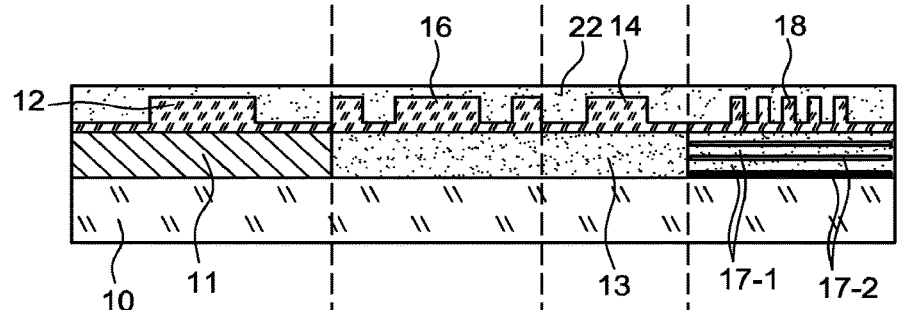

Then with reference to FIG. 3g, the different optoelectronic structures (wave guides 12, 14, modulation sections 16, coupling sections 14) are formed by steps of lithography, doping, etching, deposition of oxide, CMP, etc. applied to the transferred layer 31. A silica layer 22 covers these different structures.

This "single transfer" variant has the advantage of simplicity. Nevertheless, due to the heat treatments implemented in particular during the production of the different optoelectronic structures, it cannot make it possible to produce RF components exploiting high resistivity silicon.

The "double transfer" variant illustrated by FIGS. 4a-4k makes it possible to get round this difficulty.

Starting from a solid part made of silicon 10, a localised superficial region is subjected to an implantation in order to form a superficial portion of high resistivity 15 (FIG. 4a). A passivation layer may then cover this superficial portion.

Figure 4B:
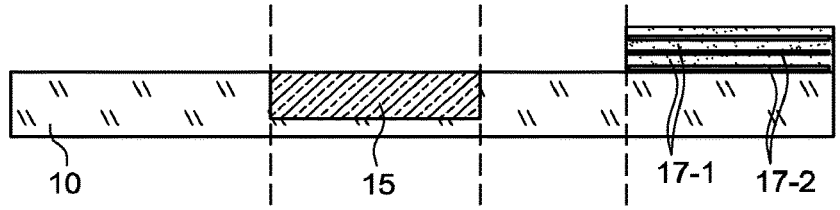
Figure 4C:
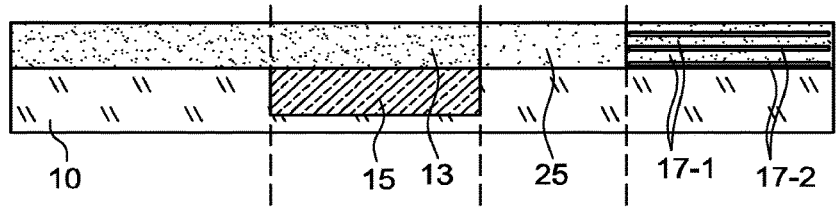

When a fourth optical fibre coupling region R4 is desired, the formation of the multilayer mirror is then carried out on an area of the solid part while alternating the deposition of silica layers 17-1 and silicon layers 17-2 (FIG. 4b). The deposition of a silica layer 13 on the solid part made of silicon 10 is then carried out (FIG. 4c). In the example represented, a layer of $TiO_2$ 25 is locally deposited to form a pre-structured region for athermal component. A heat dissipation layer may also be locally deposited. and one or more metal layers may be locally integrated within the silica layer 13 or the heat dissipation layer to serve as heater or mirror.

Figure 4D:
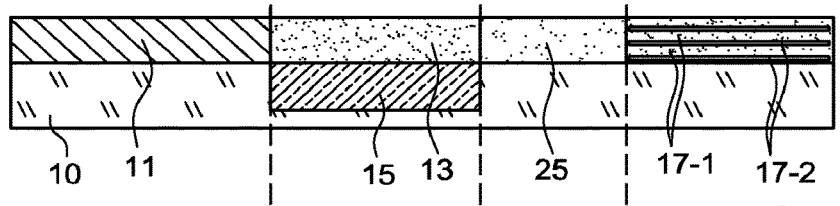

A localised etching of the silica layer 13 is then carried out, followed by the localised deposition of the heat dissipation layer 11 of the first region R1, for example made of AlN (FIG. 4d)

Figure 4E:
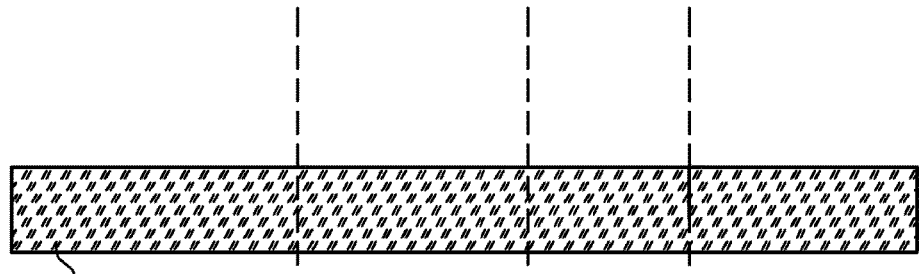
Figure 4F:
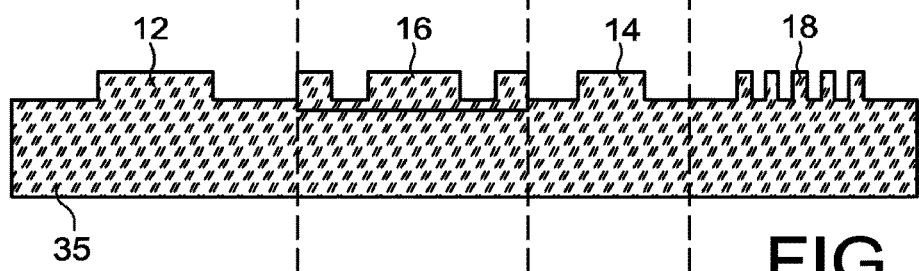
Figure 4G:
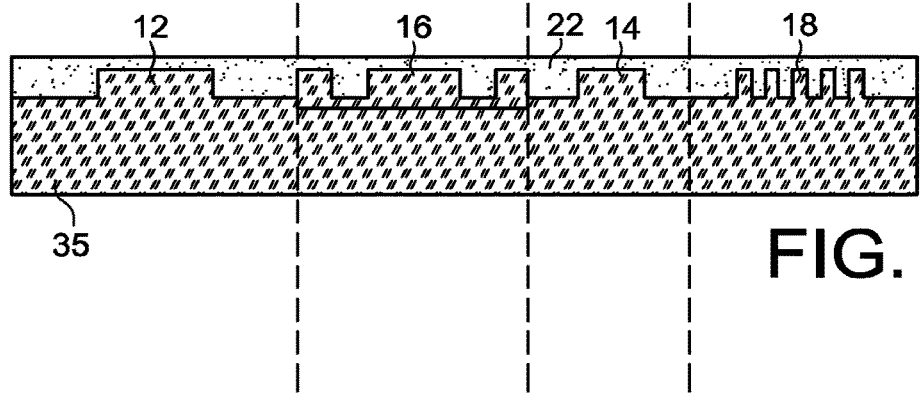

Then, as represented in FIGS. 4e-4f, the formation of different opto-electronic structures (waveguides 12, 14, modulation sections 16, coupling sections 14) is then carried out by steps of lithography, doping, etching, deposition of oxide, CMP, etc. implemented on a substrate made of monocrystalline silicon 35, called intermediate substrate. A silica layer 32 is deposited which covers these different structures.

Figure 4H:
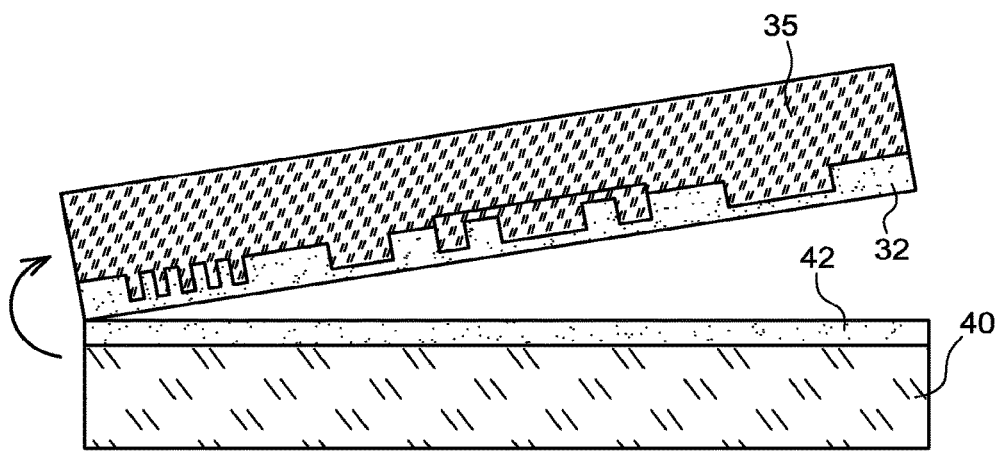
Figure 4I:
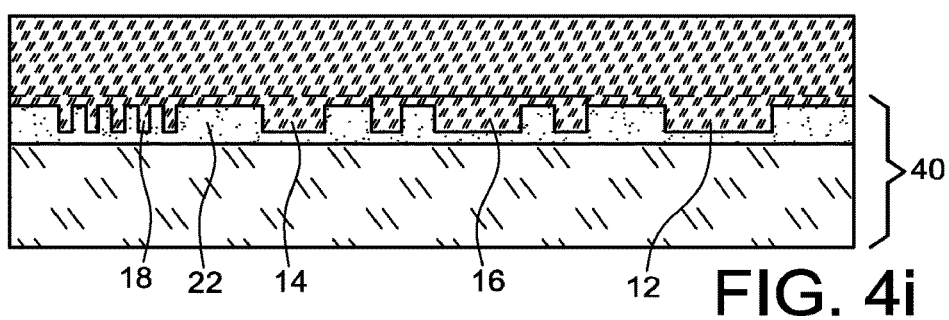
Figure 4J:
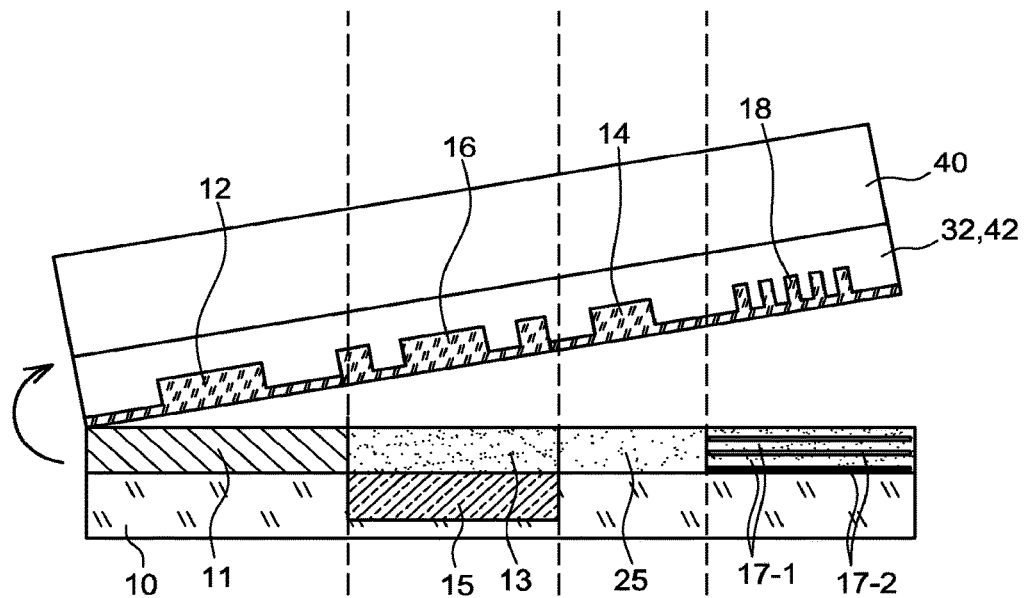
Figure 4K:
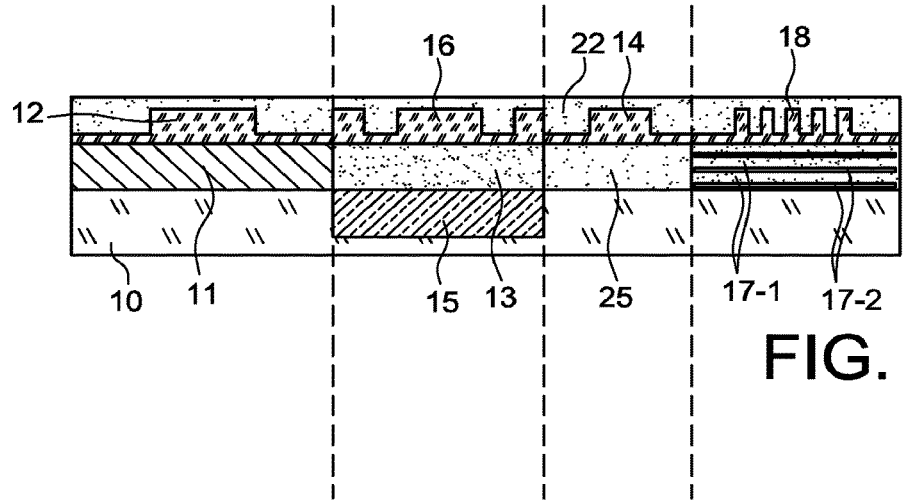

Then as represented in FIGS. 4h and 4i, a (first) transfer of the optoelectronic structures 12, 14, 16, 18 is carried out from the intermediate substrate 35 onto a substrate, covered with a silica layer 42 in the example represented, called donor substrate 40. This transfer may be carried out according to the Smart Cut™ method, the intermediate substrate 35 having been subjected beforehand to an ion implantation to form thereon a fragilised area at the level of which the intermediate substrate could be separated into two parts, one of which corresponds to the silica layer 32 and to the optoelectronic structures 12, 14, 16, 18. At the end of this transfer, the optoelectronic structures 12, 14, 16, 18 are turned upside down on the donor substrate 40.

A second transfer is carried out which makes it possible to return these structures to the spot and to obtain a pre-structured substrate according to the invention. This second transfer consists in transferring the optoelectronic structures from the donor substrate 40 to the solid part made of pre-structured silicon 10 obtained at the end of the step illustrated by FIG. 4d. This transfer may be carried out according to the Smart Cut™ method, the donor substrate 40 having been subjected beforehand to an ion implantation to form thereon a fragilised area, for example in the silica layer 32, 42, or in the donor substrate 40 in which case a step of removal by etching or CMP of the residual silicon is carried out.

The photonic circuit Cp of FIG. 2 may then be produced while finalising the laser integration (bonding of the optical amplifier 23 onto the first region), forming the vias and contacts and depositing the encapsulation layer 24.

The invention claimed is:

1. A substrate locally pre-structured for the production of photonic components, comprising:
    a solid part made of silicon;
    a first localised region of the substrate, comprising:
    a heat dissipation layer, produced in a localised manner on the surface of the solid part, such that it only covers a portion of the surface of the solid part, and made of a material of which the refractive index is less than that of silicon;
    a wave guide on the heat dissipation layer;
    a second localised region of the substrate, separate from the first region, comprising:
    an oxide layer produced in a localised manner on the surface of the solid part such that it only covers a portion of the surface of the solid part, the oxide having a heat conductivity less than that of the material of the heat dissipation layer; a wave guide on the oxide layer,
    wherein the heat dissipation layer and oxide layer are arranged directly on the surface of the solid part of the substrate, and
    in which the heat dissipation layer of the first region forms a confined area of the substrate which is surrounded by oxide at least on all sides in a planar direction of the substrate.

2. The substrate according to claim 1, in which the wave guide of the first region is made of monocrystalline silicon transferred from a donor substrate onto the heat dissipation layer and the wave guide of the second region is made of monocrystalline silicon also transferred from the donor substrate onto the oxide layer of the second region, wherein the wave guide of the first region and the wave guide of the second region are made from the same silicon material originating from the same donor substrate.

3. The substrate according to claim 1, in which the oxide layer of the second region is a layer of $SiO_2$ or $TiO_2$.

4. The substrate according claim 1, further comprising a third localised region of the substrate and formed on a localised superficial portion of the solid part in which ions are implanted to increase the resistivity thereof, the third region comprising an oxide layer on said superficial portion and a modulation section of pn or pin diode type made of monocrystalline silicon doped on the oxide layer.

5. The substrate according to claim 4, in which the third region further includes a passivation layer intersected between said superficial portion and the first oxide layer.

6. The substrate according to claim 1, further comprising a fourth localised region of the substrate which includes a multilayer mirror produced in a localised manner on the solid part and made of an alternation of layers of oxide and of silicon, and an optical fibre coupling section on the multilayer mirror.

7. The substrate according to claim 1, further comprising a fifth localised region of the substrate which includes an oxide layer on the solid part, said oxide layer incorporating a metal layer, and an optical fibre coupling section on the oxide layer.

8. The substrate according to claim 1, comprising a sixth localised region of the substrate which includes a layer on the solid part, said layer incorporating a metal layer, and a wave guide on said layer.

9. The substrate according to claim 8, in which the layer of the sixth region is an oxide layer or a layer of which the heat conductivity is greater than that of the oxide and of which the refractive index is less than that of silicon.

10. The substrate according to claim 1, in which the heat dissipation layer is a layer of aluminium nitride.

\* \* \* \* \*